United States Patent [19]

Templin

[11] Patent Number: 4,525,866
[45] Date of Patent: Jun. 25, 1985

[54] STACK MEMORY TUNING

[75] Inventor: Frank C. Templin, Arlington Heights, Ill.

[73] Assignee: Zenith Electronics Corporation, Glenview, Ill.

[21] Appl. No.: 549,695

[22] Filed: Nov. 7, 1983

[51] Int. Cl.$^3$ .............................................. H04B 1/16
[52] U.S. Cl. .................................... 455/186; 455/166
[58] Field of Search ....................... 455/166, 185, 186; 365/221

[56] References Cited

U.S. PATENT DOCUMENTS

| | | | |
|---|---|---|---|
| 3,979,680 | 9/1976 | Sakamoto | 455/186 |
| 3,990,027 | 11/1976 | Kawashima | 455/186 |
| 4,061,982 | 12/1977 | Kawashima | 455/186 |
| 4,075,567 | 2/1978 | Klank et al. | 455/186 |
| 4,138,647 | 2/1979 | Wine | 455/186 |
| 4,158,816 | 6/1979 | Wine | 455/186 |
| 4,187,469 | 2/1980 | Tanaka | 455/186 |
| 4,279,035 | 7/1981 | Skerlos | 455/186 |
| 4,298,851 | 11/1981 | Shichijo et al. | 455/186 |
| 4,367,559 | 1/1983 | Tults | 455/166 |

OTHER PUBLICATIONS

"Microcomputers/Microprocessors: Hardware, Software, and Applications" by Hilburn et al., pp. 96-97, 1976, Prentice-Hall, Inc.

Primary Examiner—Jin F. Ng

[57] ABSTRACT

A microcomputer-controlled televison receiver tuning system requires only a limited memory capacity for the storage of a limited number of preferred channels. Memory size and microcomputer programming complexity are minimized by means of a stack memory which is programmed by keyboard entry of each of the preferred channel numbers followed by selection of an ENTER key after each entry. The preferred channel numbers may thus be sequentially loaded into the stack memory in any order and accessed in increasing and decreasing numerical order by selection of channel scan tuning keys, i.e., either tuning up or tuning down through the stack. If the ENTER key is not selected, the television receiver tunes to the selected channel number which is not loaded into the stack memory. In one embodiment, only the last six channels selected with the digit and ENTER keys are stored in the stack in a first-in/first-out order. Regardless of the order in which the preferred channel numbers are stored in memory, increasing or decreasing channels are accessed sequentially upon selection of either the channel up or channel down key.

10 Claims, 11 Drawing Figures

Fig. 6

RAM MAP FOR X=1 SHOWING 12 LOCATIONS FOR 6 2-DIGIT NUMBERS, PRIOR TO PROGRAMMING.

| #6 | | 5 | | 4 | | 3 | | 2 | | #1 | |
|---|---|---|---|---|---|---|---|---|---|---|---|
| 3 | 2 | 2 | 2 | 1 | 4 | 1 | 1 | 0 | 7 | 0 | 2 |
| #11 | 10 | 9 | 8 | 7 | 6 | 5 | 4 | 3 | 2 | 1 | #0 |

STACK

RAM MAP FOR X=0 SHOWING 2 LOCATIONS FOR 1 2-DIGIT NUMBER.

CURRENT TEMP

| X | X | X | X | X | X | X | X | 2 | 0 | X | X |
|---|---|---|---|---|---|---|---|---|---|---|---|
| #11 | 10 | 9 | 8 | 7 | 6 | 5 | 4 | 3 | 2 | 1 | #0 |

Fig. 7

RAM MAP AFTER PROGRAMMING.

| #6 | | 5 | | 4 | | 3 | | 2 | | #1 | |
|---|---|---|---|---|---|---|---|---|---|---|---|
| 2 | 2 | 1 | 4 | 1 | 1 | 0 | 7 | 0 | 2 | 2 | 0 |
| #11 | 10 | 9 | 8 | 7 | 6 | 5 | 4 | 3 | 2 | 1 | #0 |

RAM MAP FOR X=0 SHOWING 2 LOCATIONS FOR 1 2-DIGIT NUMBER.

CURRENT TEMP

| X | X | X | X | X | X | X | X | 2 | 0 | X | X |
|---|---|---|---|---|---|---|---|---|---|---|---|
| #11 | 10 | 9 | 8 | 7 | 6 | 5 | 4 | 3 | 2 | 1 | #0 |

Fig. 8

RAM MAP FOR X=1 SHOWING 12 LOCATIONS FOR 6 2-DIGIT NUMBERS.

| #6 | | 5 | | 4 | | 3 | | 2 | | #1 | |
|---|---|---|---|---|---|---|---|---|---|---|---|
| 3 | 2 | 2 | 2 | 1 | 4 | 1 | 1 | 0 | 7 | 0 | 2 |
| #11 | 10 | 9 | 8 | 7 | 6 | 5 | 4 | 3 | 2 | 1 | #0 |

RAM MAP FOR X=0 SHOWING 2 LOCATIONS FOR 1 2-DIGIT NUMBER, PRIOR TO TUNING.

CURRENT TEMP

| X | X | X | X | X | X | X | X | 1 | 1 | X | X |
|---|---|---|---|---|---|---|---|---|---|---|---|
| #11 | 10 | 9 | 8 | 7 | 6 | 5 | 4 | 3 | 2 | 1 | #0 |

Fig. 9

RAM MAP FOR X=1 SHOWING 12 LOCATIONS FOR 6 2-DIGIT NUMBERS.

| #6 | | 5 | | 4 | | 3 | | 2 | | #1 | |
|---|---|---|---|---|---|---|---|---|---|---|---|
| 3 | 2 | 2 | 2 | 1 | 4 | 1 | 1 | 0 | 7 | 0 | 2 |
| #11 | 10 | 9 | 8 | 7 | 6 | 5 | 4 | 3 | 2 | 1 | #0 |

RAM MAP FOR X=0 SHOWING 2 LOCATIONS FOR 1 2-DIGIT NUMBER, AFTER TUNING.

CURRENT TEMP

| X | X | X | X | X | X | X | X | 1 | 4 | X | X |
|---|---|---|---|---|---|---|---|---|---|---|---|
| #11 | 10 | 9 | 8 | 7 | 6 | 5 | 4 | 3 | 2 | 1 | #0 |

STACK MEMORY TUNING

BACKGROUND OF THE INVENTION

This invention relates in general to television tuning systems and is particularly directed to a microcomputer-controlled television tuning system having a limited RAM and ROM for storing tuning information for a limited number of preferred channels.

Tuning systems having memory locations for the storage and recall of channel tuning information are now commonly available in television receivers. In this type of system, upon the selection of a particular channel number, binary signals stored in the memory are "read out", converted to tuning information for controlling the frequency of the television receiver's local oscillator in tuning to the carrier frequency of the desired channel, and used to display the selected channel number on a digital display. The generation of the tuning and display information is generally accomplished by means of a microcomputer in combination with a Random Access Memory (RAM) which store the channel tuning and display information. Typically, each memory bit location within the RAM corresponds to a designated channel number, or tuning frequency. The microcomputer also includes a Read Only Memory (ROM) in which is stored the microcomputer's operating program for synthesizing the channel number tuning and display signals.

The cost of these memory devices and associated tuning systems increases with the information storage capacity of the memory device. Thus, a memory having a greater data storage capacity is generally more expensive than one having a smaller storage capacity. The large number of available VHF and UHF channels in combination with the ever-increasing number of available CATV channels has required large memory devices in expensive and complex tuning systems. For example, one memory device may be dedicated to CATV channels, while another memory device may store VHF and UHF channel tuning information. In addition, those memory devices currently in use are not generally utilized in an efficient manner. For example, most memory-type tuning systems store tuning information for all available channels in spite of the fact that most viewers tune to only a limited number of preferred channels. Even in those systems having a preferred channel tuning capability tuning information for all channels may be stored in memory with "skip" and "stop" commands associated with respective non-preferred and preferred channels. In a typical lower cost preferred channel tuning system, the "skip" and "stop" features are replaced by an "all channel" tuning operation in which the television receiver stops at all channels during sequential channel scan tuning. No video display will be presented for those channels not having an associated signal, in which case noisy video and audio signals will be presented. This arrangement, in combination with the time consuming stops, presents an irritating inconvenience for the viewer.

A compromise intended to limit the size of the memory required in a television tuning system involves the storage therein of a limited number of preferred channels. The rationale behind this compromise is that even though there are a large number of available television channels, most viewers typically watch only a relatively small number of preferred channels. Thus, the storage of tuning data for only a limited number of channels to which the television receiver may be rapidly and automatically tuned reduces the size of the memory and the cost of the associated tuning system. However, in some systems having a channel skip/save capability two memories are utilized, one for storing tuning information and a second, separate memory in which is stored information for identifying those channels which are to be either skipped or saved. All of the aforementioned tuning system approaches make inefficient use of the information storage portion of the tuning system.

Prior art memory tuning systems also typically require relatively involved procedures in the storage and recall of tuning data from the memory. For example, entry of preferred channel tuning data in the memory requires conversion of the preferred channel number to a bit address location for storage in RAM. Thus, each channel number corresponds to a predetermined bit location in RAM. In addition, the recall of preferred channel data upon selection of a preferred channel number may require not only scanning of the entire RAM array, but also converting of the RAM address of the preferred channel to tuning data necessary for tuning to the desired channel. Thus, an intermediate step is involved in the storage and recall of tuning data in the memory. This intermediate step requires additional microcomputer programming available only in more complex and expensive microcomputer chips.

Finally, even those memory type tuning systems in which tuning data for only a limited number of preferred channels is stored suffer from operating limitations. For example, if in the CATV mode of operation and the channel selector is scanned through an air channel, i.e., VHF or UHF, the channel selector will typically stop scanning at the designated air channel even though in the CATV mode of operation. But since the corresponding CATV channel is not a preferred, selected channel, a video image will not appear on the television receiver's cathode ray tube. This irritating consequence not only defeats the purpose of rapid, automatic channel scan selection, but also underscores the inefficiency of memory utilization in prior art memory type tuning systems.

U.S. Pat. Nos. 4,138,647 and 4,158,816 to Wine disclose memory type tuning systems for storing tuning information for a limited number of preferred channels. The former patent includes a memory for the storage of tuning information corresponding to a limited number of preferred tuning positions and decoder means for locating an unused memory location containing undesired information into which new information corresponding to a desired tuning position may be entered and comparison means for locating a duplicate memory location containing information corresponding to the same tuning position as the new information. In this tuning system a counter is sequenced through the addresses for all the memory locations to search for a match between the contents of a display counter and the display memory portion of one of the memory locations in tuning to a preferred channel. The latter patent discloses a tuning system having a memory with a plurality of memory locations for storing tuning information associated with various channels a viewer may select. An input complementor is provided for generating, in response to viewer control, the complement of a binary word stored in memory so as to identify the associated channel as a nonpreferred channel. This causes memory locations containing binary signals representing illegal channel numbers to be skipped during the normal channel selection mode of operation of the tuning system. U.S. Pat. No. 4,187,469 to Tanaka discloses a television receiver having two modes of operation in which, in a first programmed channel mode, each entered channel number is automatically searched for among the limited locations of a memory with the system stopping only at programmed channels. In a second, skipped channel mode, only unprogrammed channel numbers are produced and displayed to the viewer in order to indicate to the viewer the unused memory locations in which program tuning information may be stored.

The present invention is intended to overcome the aforementioned limitations of the prior art by providing stack memory tuning for a television receiver in which a limited number of preferred channel numbers are stored in sequence in a stack memory and are recalled therefrom in numerical order during rapid channel scanning selection. This approach results in as much as a 75% reduction in required memory capacity and program length over currently available memory type television receiver tuning systems.

OBJECTS OF THE INVENTION

Accordingly, it is an object of the present invention to provide an improved tuning system for automatically tuning a television receiver to a limited number of preferred channels.

Another object of the present invention is to reduce the cost of microcomputer-controlled television tuning systems by providing a system requiring limited RAM and ROM and yet is capable of automatically tuning to selected channels.

Yet another object of the present invention is to provide a television tuning system capable of storing tuning data for a limited number of preferred channels for rapidly tuning thereto, wherein the list of preferred channels may be easily and continuously updated.

A further object of the present invention is to provide a television tuning system having up/down channel selection scan wherein only a limited number of preferred channels are scanned for more rapid channel tuning.

A still further object of the present invention is to provide a channel selection and tuning system for a television receiver which facilitates the identification and selection of a limited number of preferred channels stored in a programmable memory under the control of a microcomputer.

BRIEF DESCRIPTION OF THE DRAWINGS

The appended claims set forth those novel features believed characteristic of the invention. However, the invention itself as well as further objects and advantages thereof, will best be understood by reference to the following detailed description of a preferred embodiment taken in conjunction with the accompanying drawings, where like reference numerals designate like elements throughout the several views, in which:

FIGS. 6 and 7 show the storage and shifting of channel tuning information in programming a stack memory device with preferred channel numbers in accordance with the present invention; and FIGS. 8 and 9 show the storage and shifting of channel tuning information in a stack memory device during channel selection by channel number scanning.

DESCRIPTION OF THE PREFERRED EMBODIMENT

Figure 1:
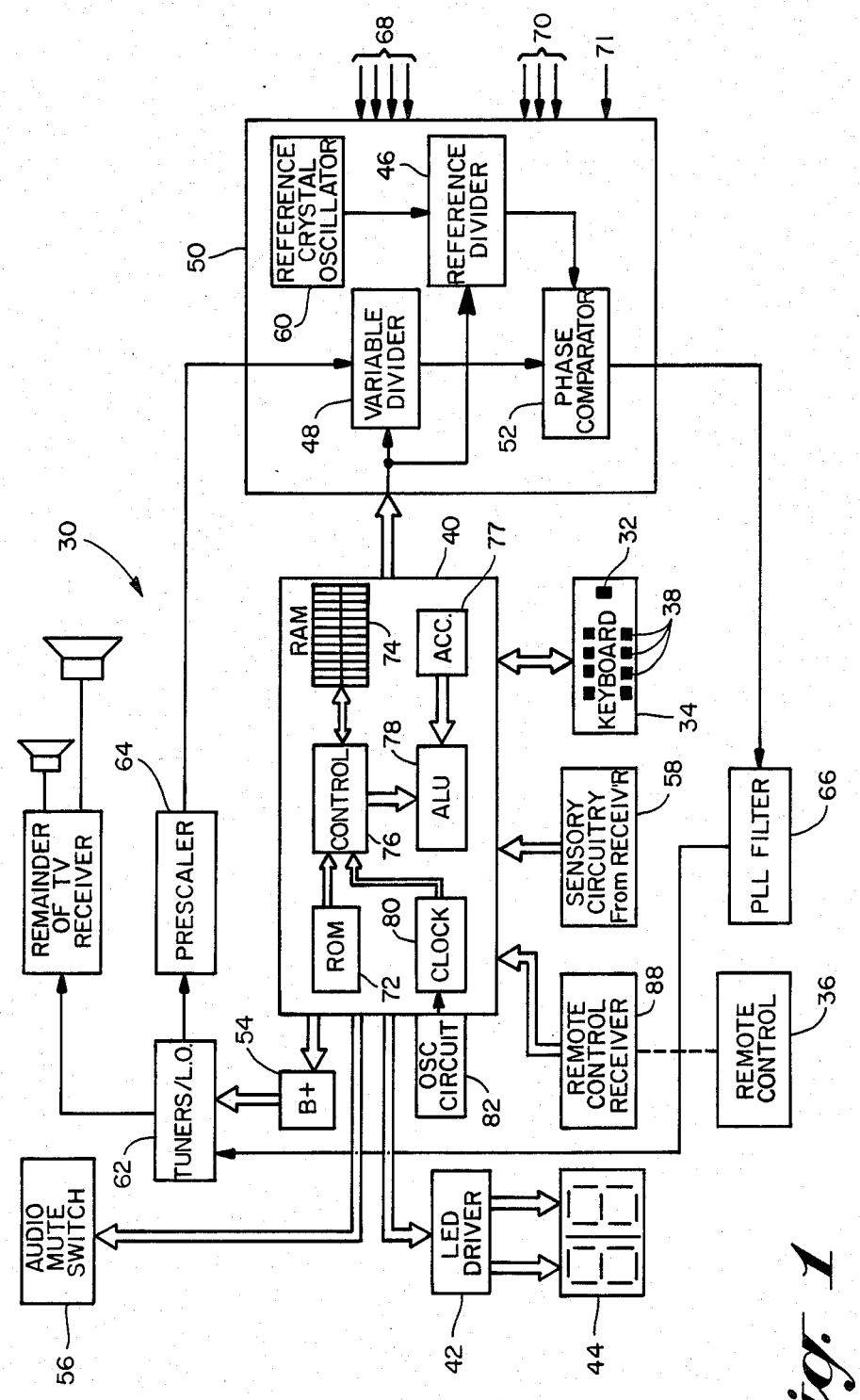
FIG. 1 is a generalized block diagram of a television tuning system incorporating the stack memory tuning features of the present invention.

Referring to the block diagram of FIG. 1, a stack memory tuning system 30 in accordance with the present invention is shown. Channel selection is made by keyboard 34 or by remote control 36 entry via a remote control receiver 88. Touch pads 38 on the front panel of the keyboard 34 and on the remote controller 36 (not shown) provide direct entry of the channel number digits to a microcomputer 40. When the desired channel number is entered the following events occur: (1) a microcomputer output signal to an LED drive/decoder 42 activates the proper segments of a seven segment LED display 44 in displaying the channel number selected; (2) the microcomputer 40 loads the correct divide ratio for the selected channel into the reference divider 46 and the variable divider 48 of a phase lock loop (PLL) 50 which alters the input frequencies to a phase comparator 52; (3) the microcomputer 40 determines the band in which the selected channel is, i.e., LOW VHF, HIGH VHF, UHF or CATV and applies the proper bandswitch signal to a bandswitch circuit 54 via a tuner/local oscillator 62; and (4) the microcomputer 40 activates an audio mute switch 56 during channel switching to provide silent channel switching for user comfort. Sensory circuits 58 receive several inputs such as system clocking information, vertical synchronization data, "enter" key selection information, and AFC tuning voltage information from which the microcomputer 40 provides edge and window tuning information to the phase lock loop 50.

Indirect frequency synthesis is accomplished by means of the phase lock loop (PLL) 50 as controlled by the microcomputer 40. In the PLL 50, a reference crystal oscillator 60 frequency is divided by a twelve stage divider network, the reference divider or counter 46, to provide a divided down signal to the phase comparator 52. The reference divider 46 includes four fixed and eight programmable divider stages. Similarly, the output of a tuner/local oscillator 62 is divided by a fixed prescaler 64 in providing an input signal at a divided down frequency to the PLL chip 50. Additional frequency division of this signal is accomplished in the PLL chip 50 by means of a twelve stage divider 48 with two fixed stages and ten programmable stages, the output from which is transmitted to the phase comparator 52. When the frequencies of the output signals from the variable counter 48 and the reference counter 46 to the phase comparator 52 are exactly equal, the comparator output is zero. When there is any difference between these two frequencies, the phase comparator 52 will develop an output which, when passed through the PLL filter 66, provides a correction voltage to the tuner/local oscillator 62 to change the local oscillator frequency until the two signals have exactly the same frequency. The local oscillator 62 then assumes the stability of the crystal reference oscillator 60. This frequency comparison is done continually in order to compensate for tuner oscillator drift. Although PLL 50 and microcomputer 40 are shown in FIG. 1 as separate circuits, they could as easily be provided in a single integrated circuit in the present invention.

In order for the phase comparator 52 to operate correctly the divided down local oscillator frequency should always be about equal to the other comparator input from the reference crystal oscillator 60 of about 1 KHz. Since the oscillator frequencies are different for each channel, a different divide ratio must be used for each selected channel in programming the reference divider 46 and the variable divider 48. Programming of these dividers is accomplished by the microcomputer 40 which establishes the correct divide ratio for tuning to the selected channel. Four inputs from the microcomputer 40 to the PLL 50 are data lines 68 which transmit serial data from the microcomputer 40 to the PLL 50 for controlling the various dividers. Three data steering lines 70 are also input to the PLL chip 50 for addressing the appropriate latch (not shown) in the PLL. The eighth input from the microcomputer 40 to the PLL 50 is an ENABLE line 71 which transmits a load data command to permit the PLL to receive only correct data and to exclude other information which may be present on the data line at various times. The output of the phase comparator 52 is a series of pulses the duty cycle of which is a function of the difference between the reference frequency of 1 KHz and the divided down local oscillator frequency. These pulses are filtered by the active PLL filter 66 resulting in a DC voltage with a negligible amount of 1 KHz ripple delivered to the tuner/local oscillator 62.

Input pulses to the PLL filter 66 occur in the steady state due to leakage and drift in the PLL system. Negative-going pulses with respect to the tuner system's quiescent DC level occur when the system transitions from a lower oscillator frequency to a higher oscillator frequency. Positive-going pulses occur for changes from higher to lower frequencies or to compensate for leakage or drift conditions in turner circuitry.

Binary signals generated by the keyboard 34 are transmitted to the microcomputer 40. The microcomputer 40 is a four bit, E/D MOS integrated circuit with a ROM 72, a RAM 74, a clock 80, an accumulator 77 and a controller 76. The microcomputer stores instructions and data, periodically updates the stored data, compares both stored and real-time data and makes decisions based upon these comparisons by means of logic instructions in providing system control. The ROM 72 is mask-generated, nonvolatile, factory produced memory matrix which includes a plurality of memory locations or "bytes" of 8 bits each. Program instructions and data are stored in ROM 72. Hexadecimal notation is used by the ROM from which instructions and data are sequentially removed by the microcomputer controller 76 in carrying out program functions.

Information stored in the RAM 74, which is a volatile memory, is lost when the receiver is turned off. However, information stored in the ROM 72 is not lost either when the receiver is turned off or when power is removed from the receiver. When the television receiver is again turned on, the microcomputer program initializes the RAM data from the ROM 72 which causes the binary signals representing the first instruction stored in the ROM 72 to be coupled to the microcomputer controller 76 and causes various other portions of the microcomputer chip 40 to be initialized for proper future operation when power is applied to the microcomputer 40. An arithmetic and logic unit (ALU) 78 receives binary control signals from the microcomputer controller 76 and performs the required arithmetic or logic operation.

Microcomputer chip timing is provided by means of an oscillator circuit 82 on the microcomputer chip 40 which generates the clock signal necessary to perform a given operation. The microcomuter's clock generator 80 is driven by the oscillator circuit 82, portions of which are located internal to and external to the microcomputer chip 40.

Figure 2:
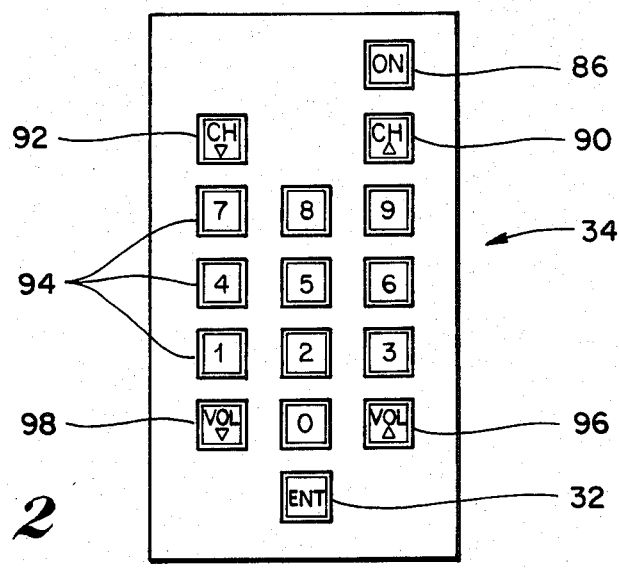
FIG. 2 shows the arrangement of selectable controls on a channel selection keyboard for use in combination with the present invention.

The channel number selector keyboard 34 utilized in a preferred embodiment of the present invention is shown in greater detail in FIG. 2. It includes a plurality of pressure actuated switches for initiating various functions in the present invention. A pressure sensitive ON selector switch 86 provides for turning the receiver on and off. Pressure sensitive VOLUME UP and VOLUME DOWN switches, 96 and 98 respectively, provide incremental stepping of receiver volume by the viewer.

Channel number memory entry and channel selection is made by means of digital selector keys 94 which are numbered 0 through 9. Three output scan lines (not shown) are arranged in such a way as to represent the vertical X-axis of the keyboard 34 (three vertical rows of keys). The horizontal Y-axis of the keyboard is represented by six output lines. When a key is depressed, the appropriate X-Y contact is made. The contact closure transfers the pulse back to microcomputer 40 via one of the five output lines. The microcomputer detects the pulse, producing the desired digit on the LED display 44.

Figure 3:
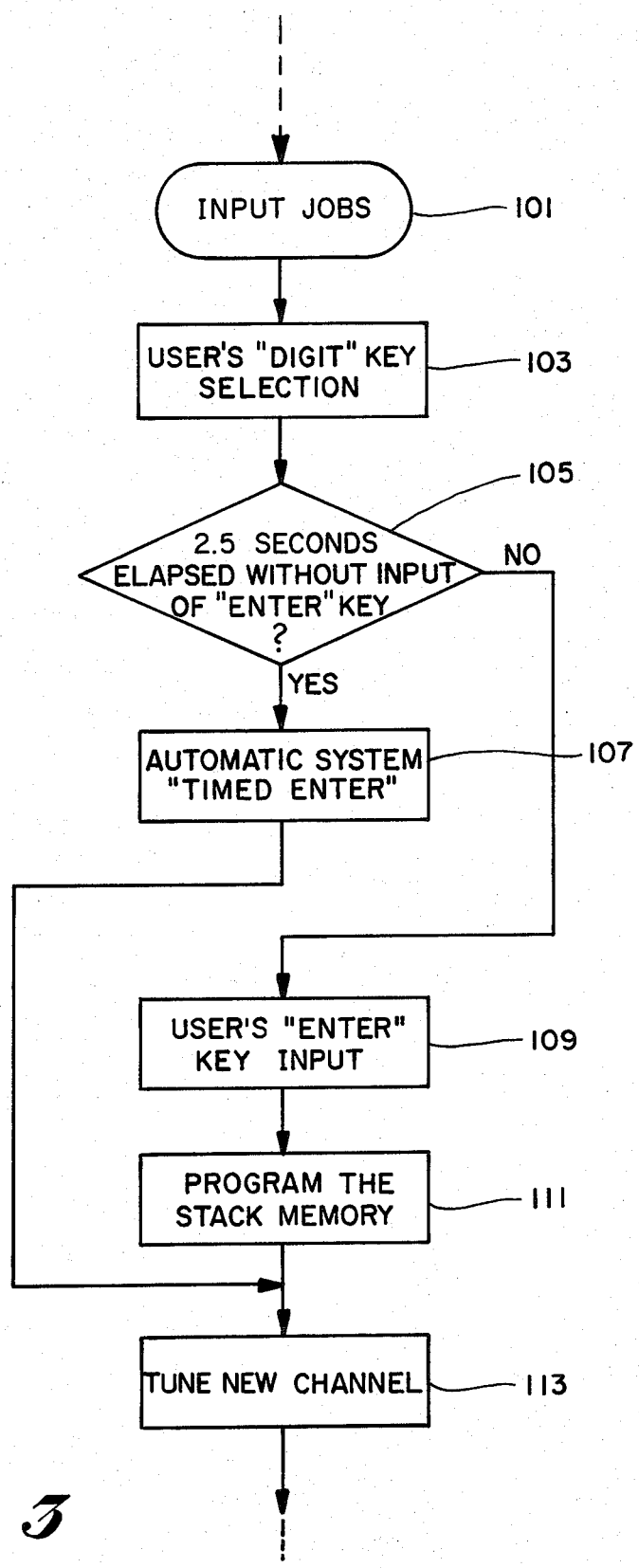
FIG. 3 is a simplified flow chart showing the user initiated steps involved in selecting a new channel number as well as entering a channel number in the stack memory.

Referring to FIG. 3, there is shown a simplified flow chart illustrating the user initiated steps involved in selecting a new channel number as well as entering a channel number in the stack memory in accordance with the present invention. Prior to entering this routine, microcomputer 40 executes various input jobs at step 101 which include such tasks as keyboard scanning and key code generation. At step 103, user selection of a digit key, or keys, is detected which initiates a software countdown. At step 105, microcomputer 40 determines whether the ENTER key 32 has been selected within 2.5 seconds of digit key entry as detected at step 103. If the 2.5 second period elapses without selection of the ENTER key 32, the program proceeds to step 107 and initiates an automatic system TIMED ENTER routine. This routine involves the transfer of the selected channel number to the appropriate location in RAM 74 for initiating tuning to this channel number at step 113. If the ENTER key 32 is selected within the aforementioned predetermined period of channel number entry as determined at step 105, the program branches to step 109 for detecting ENTER key 32 selection. This causes the selected channel number to be stored in stack memory 74 at step 111. The program also stores the thus selected channel number in the current memory location in the stack memory 74 for initiating tuning of the television receiver to the selected channel number at step 113. A detailed description of the operation of microcomputer 40 in tuning to and storing in RAM 74 a selected channel number is provided below. In addition, details regarding the entry of individual channel numbers as contemplated by the present invention may be found in U.S. Pat. No. 4,279,035 to Skerlos, which is incorporated herein by reference. However, any of the more conventional means and methods for entering channel numbers by means of a keyboard matrix could be used equally as well in the present invention.

Channel selection may also be accomplished sequentially in an up or down fashion by means of either channel UP or channel DOWN selectors 90, 92. Selection of the channel UP selector 90 results in the sequencing of the tuning system of the present invention in an upward direction through a selected number of predetermined channels stored in a stack memory in RAM 74. Similarly, selection of the channel DOWN selector 92 causes the tuning system of the present invention to sequentially scan through the available channel numbers, stopping only at those preferred channels which have been stored in the RAM's stack memory. Thus, the present invention contemplates the entry of a limited number of preferred channel numbers in memory by means of the combination of digit keys 94 and the ENTER key 116 and the selection of the channel numbers thus entered into memory for viewing by means of either channel UP or channel DOWN selectors 90, 92. While the details of the apparatus for controlling various functions of the television receiver are shown with respect to keyboard 34 which typically would be integrated with or located on the television receiver, the configuration and operation of keyboard 34 as described herein is equally applicable to the remote controller 36 which could include similar controls for remotely implementing the same control functions in the television receiver.

Figure 4:
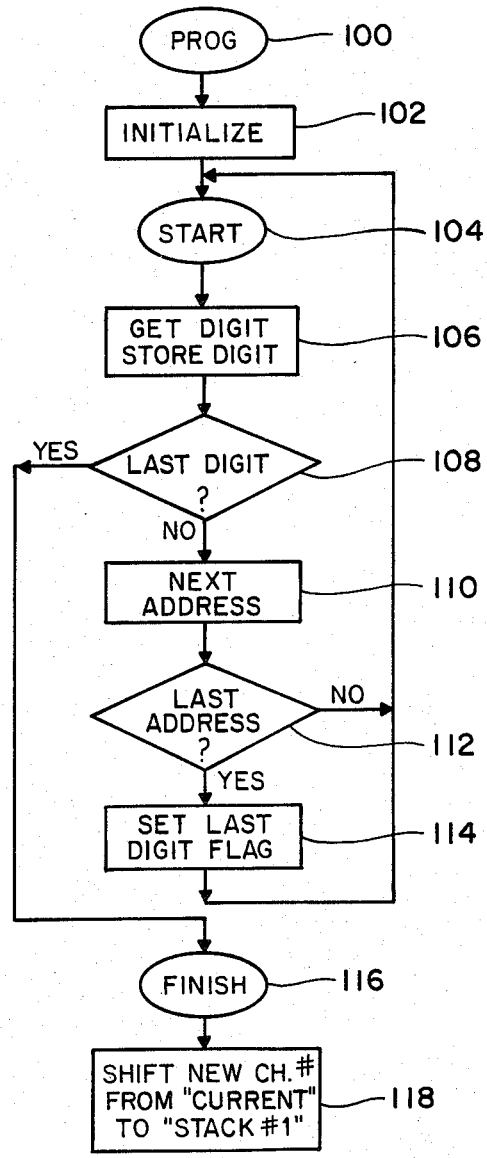
FIG. 4 is a simplified flow chart showing the steps involved in entering the channel numbers of a limited number of preferred channels in memory under the control of a microcomputer in accordance with the present invention.
Figure 5A:
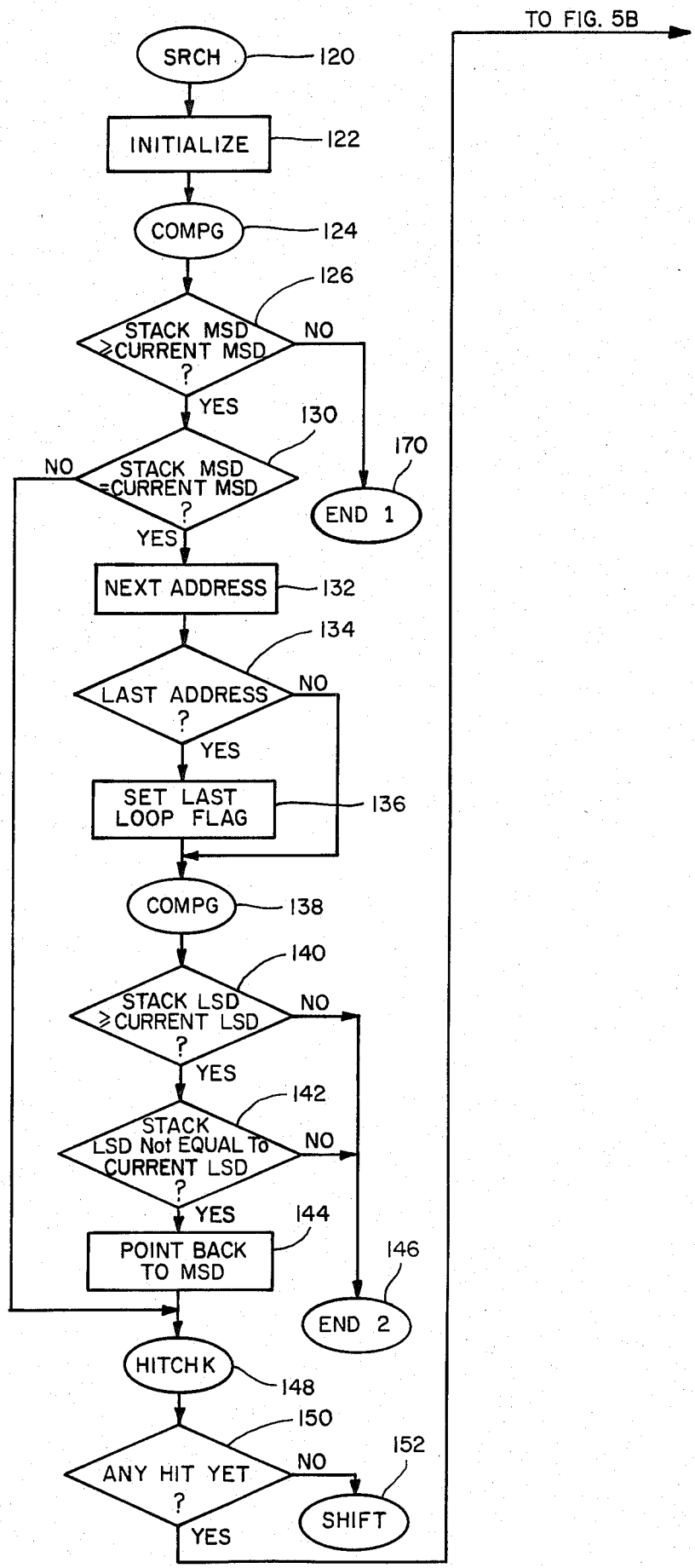
FIGS. 5A, 5B and 5C represent a simplified flow chart showing the various steps involved in preferred channel selection using a stack memory in which is stored channel tuning information in accordance with the present invention.
Figure 5B:
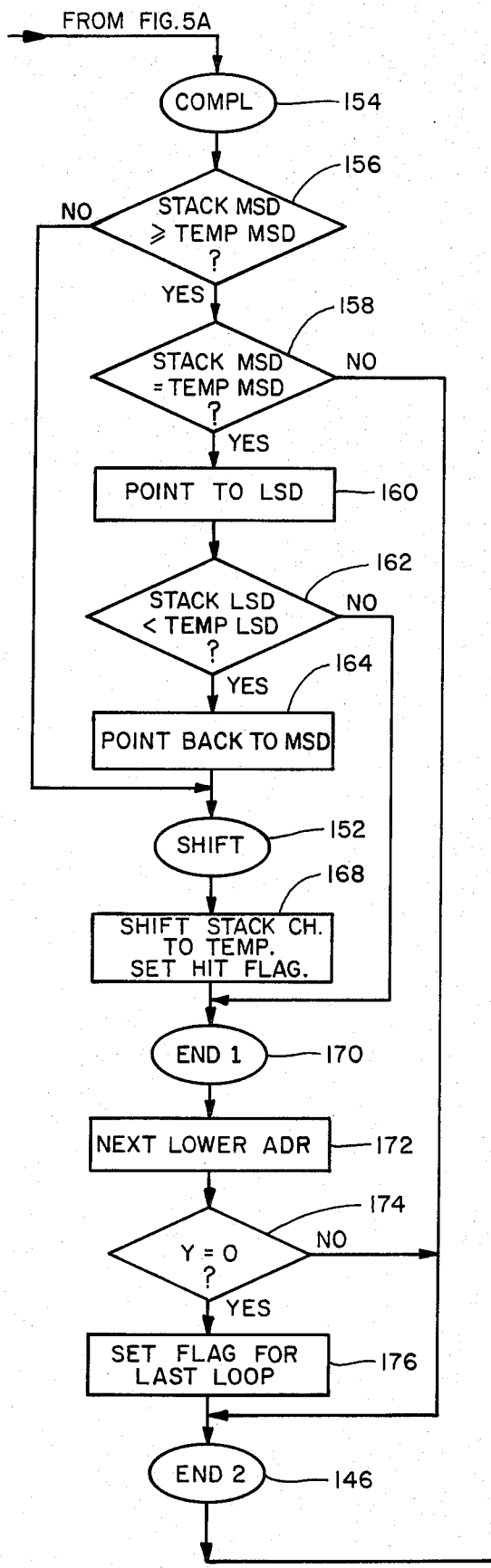
Figure 5B:
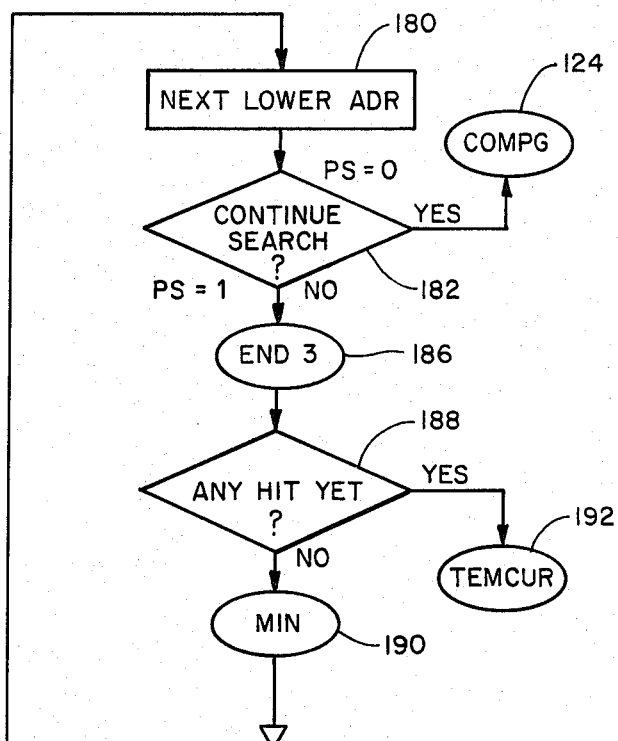
Figure 5C:
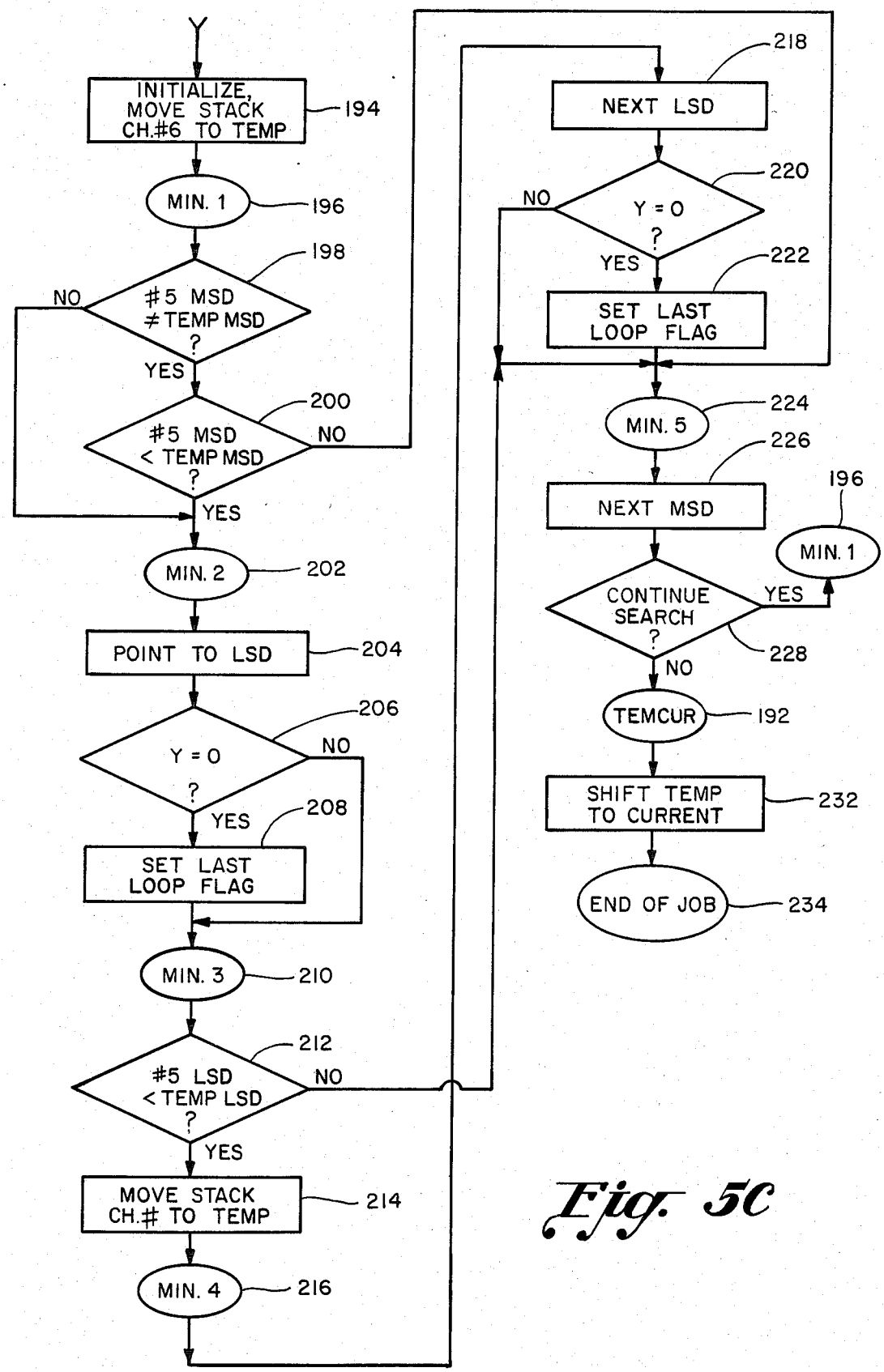

The manner in which digital signals are processed in the stack memory tuning system 30 of the present invention in controlling various tuner system operations during preferred channel number entry in memory and channel selection processes will now be explained with reference to the flow charts shown in FIGS. 4 and 5A, 5B and 5C and FIGS. 6 through 9. More specifically, FIG. 4 shows the steps involved in storing a preferred channel number in the RAM in accordance with the present invention. Similarly, FIGS. 5A, 5B and 5C show the steps involved in tuning to a channel number which has been stored as a preferred channel in the RAM in accordance with the present invention. In referring to FIGS. 4 and 5A, 5B and 5C, an oval symbol indicates the start of an operational sequence, a rectangle indicates an instruction or set of instructions resulting in the performance of a control function, and a diamond indicates a decision point based upon the comparison of binary signal inputs. In addition, a computer listing for carrying out stack memory tuning in accordance with the present invention as shown in FIGS. 4 and 5A, 5B and 5C is presented in Table I. Contained in this program assembly listing is such information as memory addresses, object code, statement number and additional source statement information including commonly used mnemonics relating to various steps carried out in accordance with the present invention.

Shown in FIGS. 6 through 9 are the contents of two rows of a RAM map during various stages of the programming of and tuning to a selected channel number. The lower row represents a current/temporary memory with $X=0$ while the upper row represents a stack memory with $X=1$ in a two row matrix memory. The Y coordinate is shown beneath each row. The lower row of the matrix memory serves as a temporary, or scratchpad, memory while the upper row ($X=1$) is a stack memory in which tuning information representing a selected channel is shifted into the $Y=0$ and $Y=1$ locations with the contents of the stack memory shifted to the left when a new channel number is stored in memory. With the storage of a new channel number in the stack memory, the first stored channel number located at $X=1$ and $Y=10,11$ is shifted out of the stack memory and is no longer available in a channel UP or channel DOWN tuning operation.

TABLE I

```
1 STACK   BGN    A,0  STACK PROGRAMMING
2 *
     THE SYSTEM INITIALLY HAS THE CHANNEL NUMBERS IN THE
     STACK AS SHOWN BELOW IN THE RAM MAP FOR X=1.  THE SYSTEM
     HAS PREVIOUSLY DETECTED A CHANNEL 20 INPUT, FOLLOWED BY THE
     ENTER KEY.  THE NEW CHANNEL 20 IS MOVED INTO THE "CURRENT"
     LOCATION AS SHOWN IN RAM MAP X=0 TO TRIGGER A PLL TUNING JOB
     AND THE STACK PROGRAMMING JOB.
3 *
4 *RAM MAP FOR X=1 SHOWING 12 LOCATIONS FOR 6 2-DIGIT NUMBERS
5 *   (Y ADDRESSES FROM 11 to 0 ARE SHOWN BELOW THE RAM MAP)
6 *
7 *                     STACK - BEFORE PROGRAMMING JOB
8 *                     -----
9 *
```

```
            10 *   #6      #5       #4      #3      #2      #1
            11
            12   ┌───┬───┬───┬───┬───┬───┬───┬───┬───┬───┬───┬───┐
            13   │ 3 │ 2 │ 2 │ 2 │ 1 │ 4 │ 1 │ 1 │ 0 │ 7 │ 0 │ 2 │   X=1
            14   └───┴───┴───┴───┴───┴───┴───┴───┴───┴───┴───┴───┘
            15
            16  *11  10   9   8   7   6   5   4   3   2   1   0
            17 *
            18 *
            19 *
            20 *RAM MAP FOR X=0 SHOWING 2 LOCATIONS FOR A 2-DIGIT NUMBER
            21 *
            22 *                                   CURRENT   TEMP
            23   ┌───┬───┬───┬───┬───┬───┬───┬───┬───┬───┬───┬───┐
            24   │   │   │   │   │   │   │   │   │ 2 │ 0 │   │   │   X=0
            25   └───┴───┴───┴───┴───┴───┴───┴───┴───┴───┴───┴───┘
            26
            27
            28 *
            29 *
            30 *       BEGIN SHIFT OF CHANNEL NUMBERS IN STACK
            31 *       FINISH BY SHIFTING NEW CHANNEL NUMBER INTO STACK
            32 *
            33 *
0000 00     34            NOP
0001 00     35            NOP
0002 3A     36  PROG     RP              RESET PS LOOP CONTROL FLAG
0003 A1     37           LX    1         POINT TO STACK
0004 69     38           LY    9         POINT TO #5 - MSD
            39 *
            40 *    START LOOP TO SHIFT CHANNEL NUMBERS CURRENTLY IN STACK
            41 *
0005 0E     42  START    LIC             GET DIGIT
0006 2C     43           ICY             POINT TO DESTINATION
0007 0D     44           STDC            STORE DIGIT
0008 E611   45           BP    FINISH    QUIT LOOPING - DO SHIFT OF NEW CH #
000A 2D     46           DCY
000B 2D     47           DCY             POINT TO LSD
000C E005   48           BNZ   START     REPEAT
000E 3E     49           SP              SET PS FLAG
000F 4005   50           JMP   START     DO LAST SHIFT IN LOOP
            51 *
0011 23     52  FINISH   LD    3         GET NEW CH # - MSD
0012 61     53           LY    1         POINT TO #1 - MSD
0013 0D     54           STDC            STORE DIGIT
0014 22     55           LD    2         GET NEW CH # - LSD
0015 0A     56           ST              STORE DIGIT
0016 00     57           NOP
            58 *
            59 *
            60 *       END OF SAMPLE STACK PROGRAMMING JOB
            61 *
            62 *
            63 *    RAM MAPS SHOW THE DATA AS IT APPEARS AFTER THE SHIFTING
            64 *
            65 *   #6      #5       #4      #3      #2      #1
            66
            67   ┌───┬───┬───┬───┬───┬───┬───┬───┬───┬───┬───┬───┐
            68   │ 2 │ 2 │ 1 │ 4 │ 1 │ 1 │ 0 │ 7 │ 0 │ 2 │ 2 │ 0 │   X=1
            69   └───┴───┴───┴───┴───┴───┴───┴───┴───┴───┴───┴───┘
            70
```

```
 71 *11 10  9  8  7  6  5  4  3  2  1  0
 72 *
 73 *
 74 *
 75 *   RAM MAP FOR X=0 SHOWING 2 LOCATIONS FOR A 2-DIGIT NUMBER
 76 *
 77 *                                CURRENT  TEMP
 78
 79                                   ┌─┬─┐
 80                                   │2│0│           X=0
 81                                   └─┴─┘
 82
 83 *11 10  9  8  7  6  5  4  3  2  1  0
 84 *
 85 *
 86 *
 87 *
 88 *
 89 *
 90        ORG    X'0100'  SAMPLE PROGRAM FOR STACK TUNING JOB
 91 *
 92 *
 93 *   RAM MAP FOR X=1 SHOWING 12 LOCATIONS FOR 6 2-DIGIT NUMBERS
 94 *     (Y ADDRESSES FROM 11 TO 0 ARE SHOWN BELOW THE RAM MAP)
 95 *
 96 *                        STACK  -  BEFORE TUNING JOB
 97 *                        -----
 98 *
 99 *    #6       #5      #4       #3       #2       #1
100
101     ┌─┬─┐  ┌─┬─┐  ┌─┬─┐  ┌─┬─┐  ┌─┬─┐  ┌─┬─┐
102     │3│2│  │2│2│  │1│4│  │1│1│  │0│7│  │0│2│      X=1
103     └─┴─┘  └─┴─┘  └─┴─┘  └─┴─┘  └─┴─┘  └─┴─┘
104
105 *11 10  9  8  7  6  5  4  3  2  1  0
106 *
107 *
108 *
109 *   RAM MAP FOR X=0 SHOWING 2 LOCATIONS FOR A 2-DIGIT NUMBER
110 *
111 *                                CURRENT  TEMP
112
113                                   ┌─┬─┐
114                                   │1│1│           X=0
115                                   └─┴─┘
116
117 *11 10  9  8  7  6  5  4  3  2  1  0
118 *
119 *
120 *     THE SYSTEM IS CURRENTLY TUNED TO CHANNEL 11.
121 *     THE SYSTEM HAS DETECTED A CHANNEL UP KEY INPUT.
122 *     THE FOLLOWING SOFTWARE SEARCHES THRU THE STACK
123 *       TO FIND THE NEXT HIGHER CHANNEL NUMBER, WHICH IT
124 *       THEN PLACES IN THE "CURRENT" LOCATION TO INITIATE
125 *       THE TUNING OF THE SYSTEM TO THE NEW CHANNEL.
126 *     IF THERE IS NO CHANNEL NUMBER HIGHER THAN THE CURRENT
127 *       CHANNEL NUMBER, THE SOFTWARE SEARCHES FOR THE LOWEST
128 *       CHANNEL NUMBER AND PLACES IT IN THE "CURRENT"
129 *       LOCATION TO INITIATE TUNING.
130 *
```

```
                131 *      SIMILAR SOFTWARE WOULD BE REQUIRED TO RESPOND TO THE
                132 *        CASE WHERE THE SYSTEM HAS DETECTED A CHANNEL DOWN KEY.
                133 *
                134 *      START SEARCH FOR NEXT HIGHER CHANNEL NUMBER
                135 *
0100  3A        136 SRCH   RP              RESET PS FLAG - LOOP CONTROL
0101  3B        137        RF              RESET FF FLAG - HIT STATUS
0102  59        138        LI    9
0103  30        139        STD   0         SET TEMP LSD AT (0,0) TO 9
0104  31        140        STD   1         SET TEMP MSD AT (0,1) TO 9
                141 *
0105  A1        142        LX    1         POINT TO STACK
0106  6B        143        LY    11        POINT TO #6 - MSD
                144 *
                145 *      COMPG COMPARES TO SEE IF CH # IN STACK IS
                146 *      GREATER THAN OR EQUAL TO CH # IN CURRENT USE.
                147 *      HIT FLAG FF IS SET WHEN HIGHER CH HAS BEEN FOUND.
                148 *      CH # IN STACK IS MOVED TO TEMP LOCATION
                149 *
0107  23        150 COMPG  LD    3         GET CURRENT MSD
0108  09        151        C               STACK MSD EQUAL TO CURRENT MSD?
0109  E12B      152        BNC   END1      NO - STACK MSD < CURRENT MSD
010B  E018      153        BNZ   HITCHK    NO - STACK MSD NOT EQUAL TO TEMP MSD
                154 *                      STACK MSD EQUAL TO CURRENT MSD
010D  2D        155        DCY             POINT TO STACK LSD
010E  E011      156        BNZ   COMPG1    CONTINUE SEARCH
0110  3E        157        SP              SET PS LOOP CONTROL FOR LAST LOOP
0111  22        158 COMPS1 LD    2         POINT TO CURRENT LSD
0112  09        159        C               STACK LSD GREATER THAN CURRENT LSD?
0113  E12F      160        BNC   END2      NO - LESS THAN - END COMPARISON
0115  E42F      161        BZ    END2      NO - STACK LSD EQUAL TO CURRENT LSD
                162 *                      STACK LSD GREATER THAN CURRENT LSD
0117  2C        163        ICY             POINT BACK TO MSD
                164 *
                165 *    HIT FLAG = 0 INDICATES THAT NO PREVIOUS COMPARISON
                166 *    HAS FOUND A CHANNEL GREATER THAN OR EQUAL TO THE
                167 *    CURRENT CHANNEL.
                168 *
0118  E326      169 HITCHK BNF   SHIFT     NO HIT YET
                170 *
                171 *      COMPL COMPARES TO SEE IF CH # IN STACK IS LESS THAN
                172 *      CH # IN TEMP LOCATION.
                173 *
011A  21        174 COMPL  LD    1         GET TEMP MSD
011B  09        175        C               STACK MSD EQUAL TO TEMP MSD?
011C  E126      176        BNC   SHIFT     NO - STACK MSD LESS THAN TEMP MSD
011E  E02B      177        BNZ   END1      NO - STACK MSD NOT EQUAL TO TEMP MSD
                178 *                      YES - STACK MSD EQUAL TO TEMP MSD
0120  2D        179 COMPL1 DCY             POINT TO STACK LSD
0121  20        180        LD    0         GET TEMP LSD
0122  09        181        C               STACK LSD LESS THAN TEMP LSD?
0123  E52F      182        BC    END2      NO
0125  2C        183        ICY             YES - POINT BACK TO MSD
                184 *
                185 *      SHIFT JOB MOVES STACK CH # TO TEMP LOCATION
                186 *
0126  0F        187 SHIFT  LDC             GET STACK MSD & POINT TO STACK LSD
0127  31        188        STD   1         STORE IT AT TEMP MSD LOCATION
0128  0E        189        LIC             GET STACK LSD & POINT TO MSD
```

```
0129 30      190         STD    0         STORE IT AT TEMP LSD LOCATION
012A 3F      191         SF               SET "HIT" FLAG
             192 *
012B 2D      193 END1    DCY              POINT TO NEXT LOWER DIGIT
012C E02F    194         BNZ    END2      HAVEN'T REACHED Y=0
012E 3E      195         SP               Y=0 - SET PS FLAG FOR LAST LOOP
012F 2D      196 END2    DCY              POINT TO NEXT LOWER DIGIT
0130 E207    197         BNP    COMPG     CONTINUE SEARCH
             198 *
0132 E753    199 END3    BF     TEMCUR    HAVE "HIT" FLAG
             200 *
             201 *       MIN JOB SEARCHES FOR LOWEST NUMBERED CHANNEL
             202 *       IN STACK AND THEN PLACES IT AT "CURRENT" LOCATION
             203 *       MOVE #6 STACK CH INTO TEMP LOCATION FOR COMPARISONS
             204 *
0134 3A      205 MIN     RP               RESET PS FLAG - LOOP CONTROL
0135 6B      206         LY     11        POINT TO STACK #6 MSD
0136 0F      207         LDC              GET IT & POINT TO STACK #6 LSD
0137 31      208         STD    1         STORE MSD AT TEMP MSD
0138 0F      209         LDC              GET STACK #6 LSD & POINT TO #5 MSD
0139 30      210         STD    0         STORE AT TEMP LSD
             211 *
013A 21      212 MIN1    LD     1         GET TEMP MSD
013B 09      213         C                #5 MSD < TEMP MSD?
013C E440    214         BZ     MIN2      NO - STACK MSD = TEMP MSD
013E E54C    215         BC     MIN4      NO - STACK MSD < TEMP MSD
0140 2D      216 MIN2    DCY              YES - POINT TO LSD
0141 E044    217         BNZ    MIN3      HAVEN'T REACHED Y=0
0143 3E      218         SP               SET PS FLAG - LAST LOOP
0144 20      219 MIN3    LD     0         SET TEMP LSD
0145 09      220         C                #5 LSD < TEMP LSD
0146 E550    221         BC     MIN5      NO
0148 0E      222         LIC              YES - GET STACK # LSD
0149 30      223         STD    0         STORE AT TEMP LSD
014A 0B      224         L                GET STACK # MSD
014B 31      225         STD    1         STORE AT TEMP MSD
014C 2D      226 MIN4    DCY              POINT TO LSD. Y=0?
014D E050    227         BNZ    MIN5      NO
014F 3E      228         SP               YES - SET LAST LOOP FLAG
0150 2D      229 MIN5    DCY              POINT TO NEXT NUMBER MSD
0151 E23A    230         BNP    MIN1      REPEAT SEARCH
             231 *
             232 *       MOVE "TEMP" CONTENTS TO "CURRENT" LOCATION
             233 *
0153 21      234 TEMCUR  LD     1         GET TEMP MSD
0154 33      235         STD    3         STORE AT CURRENT MSD
0155 20      236         LD     0         GET TEMP LSD
0156 32      237         STD    2         STORE AT CURRENT LSD
0157 00      238         NOP
             239 *
             240 *       END OF JOB
             241 *
             242 *
             243 *RAM MAP FOR X=1 SHOWING 12 LOCATIONS FOR 6 2-DIGIT NUMBERS
             244 *  (Y ADDRESSES FROM 11 TO 0 ARE SHOWN BELOW THE RAM MAP)
             245 *
             246 *                       STACK - AFTER TUNING JOB
             247 *                       -----
             248 *
```

```
              #6      #5      #4      #3      #2      #1
          ┌───┬───┬───┬───┬───┬───┬───┬───┬───┬───┬───┬───┐
          │ 3 │ 2 │ 2 │ 2 │ 1 │ 4 │ 1 │ 1 │ 0 │ 7 │ 0 │ 2 │   X=1
          └───┴───┴───┴───┴───┴───┴───┴───┴───┴───┴───┴───┘
           11  10   9   8   7   6   5   4   3   2   1   0
```

RAM MAP FOR X=0 SHOWING 2 LOCATIONS FOR A 2-DIGIT NUMBER

```
                                          CURRENT     TEMP
          ┌───┬───┬───┬───┬───┬───┬───┬───┬───┬───┬───┬───┐
          │   │   │   │   │   │   │   │   │ 1 │ 4 │   │   │   X=0
          └───┴───┴───┴───┴───┴───┴───┴───┴───┴───┴───┴───┘
           11  10   9   8   7   6   5   4   3   2   1   0
```

Briefly, when a channel number is entered via the keypads 38 on keyboard 34 it is stored in the temporary memory location X=0 and Y=1,1. Upon the selection of the ENTER key the contents of the TEMPORARY memory location are shifted to the CURRENT memory location at X=0 and Y=2,3. When this data transfer occurs in the X=0 row of the stack memory, the contents in the temporary memory location are transferred also to the X=1 and Y=0,1 location in the stack memory. It is the contents of the X=1 row of the stack memory which are read therefrom for tuning to a channel number stored therein during channel selection by means of the channel UP or DOWN selectors 90, 92. in the description of the present invention a stack memory capable of storing six channel numbers is considered. The present invention is not limited to the storage of this specific number of channels, but is described in terms of this number of preferred channels which are considered representative of the number of most frequently tuned to channels by a typical viewer.

Referring to FIG. 4, there is shown the steps carried out under the control of microcomputer 40 in storing preferred channel numbers in the stack memory. In block 100 the program for storing preferred channel numbers in the stack memory is initiated. In block 102 the microcomputer is initialized by resetting the program status loop control flag and setting the stack pointer to location X=1, Y=9 which corresponds to the most significant digit (MSD) of the channel number stored in the fifth location in the stack memory. A start loop to shift channel numbers currently in the stack to the left is then initiated at block 104. The contents of stack memory location X=1, Y=9 is then shifted to location X=1, Y=11 in block 106. The program next determines whether the last number of a given channel number has thus been shifted at block 108 and if the last number has not yet been shifted the program proceeds to the next, lower Y address at block 110. In block 112 the program determines whether the last address in the stack memory has been reached and if not, branches back up to the start of the loop to shift channel numbers currently in the stack to the left. This routine continues until each of the numbers stored in the stack memory is shifted to the left one position. This shifting process is done in sequence starting from the left and proceeding to the right, with the most significant digit (MSD) of each channel number being shifted first, followed by the shifting the least significant digit (LSD) of each channel number.

As the channel number shifting loop continues, and the last address corresponding to stack memory location X=1, Y=0 is detected, the channel number shift loop proceeds to block 114, sets the last digit flag, and proceeds back to the start of the shift channel number routine for executing a final channel number shift loop. In this final shift loop the last channel number corresponding to the LSD of the channel number stored in stack memory location Y=0,1 is detected at block 108 and the program branches to a finish instruction at block 116 causing the shifting of the newly selected channel from the CURRENT memory location in the temporary memory corresponding to X=0, Y=2,3 to the channel #1 location in the stack memory. Thus, the contents of memory location X=0 and Y=2,3 is shifted to X=1 and Y=0,1 in the RAM. This shift occurs when the ENTER key 32 is selected following entry of the digits of the desired channel number as shown in FIGS. 6 and 7.

Referring to FIGS. 5A, 5B and 5C, the stack tuning operation is initiated in block 120 in response to selection of either the channel UP or DOWN selector 90, 92. In describing the steps involved in the stack tuning operation reference is made to FIGS. 8 and 9 which show the contents of the temporary memory and stack memory during the channel number selection and channel tuning operations.

Briefly, the program shown in the form of a flow chart in FIGS. 5A, 5B and 5C stores the currently tuned channel in locations X=0 and Y=2,3. This channel is tuned to by selection of either the channel UP or DOWN selector 96, 98 and represents a channel number stored in the stack memory, in this example, in channel memory location #3. If the channel UP selector 90 is selected, the program shown in FIGS. 5A, 5B and 5C executes a search routine in order to find and tune to the next higher channel number stored in the stack memory. With channel 11 being the currently tuned to channel, it can be seen from FIG. 8 that the next higher channel stored in the stack memory is channel number 14 in channel storage location #4. Following execution of the search routine described in detail below, the next higher channel number, i.e., 14, is read from the stack memory and written into the current memory location as shown in FIG. 9. During this process, the contents of the stack memory does not change. The search routine described below in terms of FIGS. 5A, 5B and 5C involves the selection of the channel UP selector in determining and tuning to the next higher channel number stored in the stack memory. The routine involved in selection of the channel DOWN selector 92 is not provided in detail herein as its implementation would be similar to the described channel UP search routine and could easily be implemented in view of the detailed program description provided below by one skilled in the art.

In the present example, with reference to FIGS. 5A, 5B 5C, 8 and 9, the stack memory tuning system is currently tuned to channel 11. The system has detected a channel UP key input with the program then searching through the stack memory to find the next higher channel number which is then placed in the "current" location in the stack memory to initiate tuning of the system to the new channel. If there is no channel number greater than the currently tuned to channel number, the program searches for the lowest channel number and places this number in the "current" location to initiate tuning to this channel.

The program begins at step 120 by starting to search for, in the present example, the next higher channel number. At block 122 the microcomputer is initialized with the program status flag reset and various operating parameters set to an initial condition. In addition, the contents of the temporary memory location at (0,0) and (0,1) is set to 9. Finally, the program points to (1,11) in the stack memory. At block 124 the program compares to see if the channel number in stack memory location #6 is greater than or equal to the channel number in current use as shown in current memory location (0,2) and (0,3). A hit flag FF is set when the next higher channel has been found and the channel number thus selected in the stack memory is moved to the aforementioned temporary location in the memory.

The comparison between the channel number stored in location #6 in the stack memory and the currently tuned to channel number in the current memory location initially involves a comparison of the most significant digits (MSDs) of these channel numbers in block 126. If the MSD of the channel number in the stack memory is not greater than or equal to the MSD of the currently tuned to channel, the program branches to END 1 at block 170. If the stack memory channel number MSD is greater than or equal to the MSD of the currently tuned to channel, the program then determines whether this MSD is equal to the MSD of the currently tuned to channel at block 130. If the MSD of the stack memory channel number is not equal to the MSD of the currently tuned to channel, the program branches to HIT CHK at block 148 for executing a check in order to determine whether a higher channel number has been found.

If the MSD of the stack memory channel equals the MSD of the currently tuned to channel number, the program branches at block 130 and points to the next lower address at block 132 and determines whether the next address thus advanced to is the last address in the stack memory at block 134. If it is determined that the next address is not the last address, the program then branches to a COMPG1 routine at block 138 where the least significant digits (LSDs) of these channel numbers are compared. If it is determined at block 134 that the next address is the last address, the program sets a last loop flag in the microcomputer and initiates the comparison of LSD's of the respective channel numbers at block 138.

At block 140 the program compares the LSD's of the stack memory and current channel numbers and if the stack memory LSD is not greater than or equal to the current channel LSD, the program branches to an END 2 routine at block 146. If at block 140 it is determined that the LSD of the stack memory channel number is greater than or equal to the LSD of the current channel number, the program branches to block 142 where it determines if the stack memory channel number LSD is equal to the current channel LSD. If the LSD's of the respective channel numbers are equal, the program branches to the END 2 block 146. If it is determined at block 142 that the respective LSD's are not equal, the program points back to the MSD of the stack memory channel number at block 144.

A check is initiated at block 148 to determine if any previous comparison has found a channel number greater than or equal to the current channel number at block 148. If a HIT has not been detected, or if this check fails to indicate a previous comparison resulting in a finding of a channel number greater than or equal to the current channel number, the program at block 150 branches to SHIFT at block 152. If at block 150 it is determined that a previous comparison has found a channel number greater than or equal to the current channel number, the program branches to COMPL at block 154 where a comparison is made to determine if the channel number in the stack memory is less than the channel number in the temporary memory location. At block 156 a comparison is made between the MSD's of these respective channel numbers and if the temporary channel number MSD is found to be less than the stack memory channel number MSD, the program branches to SHIFT at block 152. If it is determined in block 156 that the stack memory channel number MSD is greater than or equal to the temporary memory channel number MSD, the program then determines at block 158 if these two respective MSD's are equal. If it is determined that these MSD's are not equal, the program branches to END 2 at block 146. If it is found at block 158 that these respective MSD's are equal, the program then points to the stack memory LSD at step 160 and determines whether the stack memory channel number LSD is less than the temporary memory channel number LSD at block 162. If the stack memory channel number LSD is not less than the temporary memory channel number LSD, the program branches to END 1 at block 170. If it is determined that the stack memory channel number LSD is less than the temporary memory channel number LSD, the program points back to the MSD of the stack memory channel number at block 64 and proceeds to SHIFT at block 152. The program then shifts the stack memory channel number to the temporary memory location at (0,0) and (0,1) and sets the HIT flag at block 168.

The program then advances to the next lower address at step 172 and performs a check to determine whether Y=0 at step 174. If it is determined at step 174 that Y=0, the program then branches to END 2 at block 178. If it is determined that Y=0, the program then sets the last loop flag at block 176 and proceeds to END 2 where the address is decremented to the next lower address at block 180. A decision is then made on whether to continue the search at block 182. If the decision here is made to continue the search, the program proceeds back to COMPG at block 124 and compares the contents of the next lower address in the stack memory with the channel number in the current memory location. If it is determined at block 182 not to continue the search, the program branches to END 3 at block 182 in order to determine whether a previous comparison has indicated a channel number in the stack memory which is greater than or equal to the current channel number.

If at block 188 it is determined that a HIT has occurred, the program branches to TEMCUR at block 192 for moving the contents of the temporary memory location to the current memory location at block 232. If at block 188 it is determined that a HIT has not yet occurred, the program branches to MIN at block 190 and begins a search for the lowest numbered channel in the stack and, once found, places this channel number in the current memory location. This search for the lowest numbered channel in the stack memory is initiated at block 190 where the contents of stack memory location #6 is moved into the temporary memory location for comparison with the contents in stack memory channel location #5.

At MIN 1 in block 196 the comparison between the stack channel #5 location and the contents of the temporary memory location is initiated by a comparison of the MSD's of the respective channel numbers at block 198. If the MSD's of the respective channel numbers are not equal, the program branches to MIN 2 at block 202. If it is determined at block 198 that the MSD's of the respective channel numbers are not equal, the program branches to block 200 where it is determined if the MSD of the channel number located in position #5 in the stack memory is less than the MSD of the temporary channel number. If the MSD of the channel number in stack memory location #5 is found to be not less than the MSD of the temporary channel number, the program branches to MIN 5 at block 224 for comparison of the next MSD at block 226.

If the MSD of the channel number in stack memory location #5 is found to be less than the MSD of the temporary channel number at block 200 or if this number is found to be equal to the MSD of the temporary channel number at block 198, the program proceeds to MIN 2 at block 202 and points to the LSD of the channel number in the stack memory at block 204 to determine if Y=0 at block 206. If it is determined that Y does not equal 0, the program advances to MIN 3 and continues to search for the lowest channel number in the stack memory. If at block 206 it is determined that Y=0, the program sets the last loop flag at block 208 and proceeds to MIN 3 at block 210. The program at block 212 than compares the LSD's of the channel numbers in stack memory location #5 and the temporary memory location. If it is determined that the channel number in stack memory location #5 is not less than the LSD of the channel number in the temporary memory location, the program branches to MIN 5 at block 224 for comparison of the next MSD at block 226. If it is determined that the LSD of the channel number in stack memory location #5 is less than the LSD of the channel number in the temporary memory location at block 212, the program branches to block 214 and moves the stack memory channel number to the temporary memory location and proceeds to MIN 4 at block 216 and points to the next LSD at block 218. The program next determines whether Y=0 at block 220 and if Y=0, the program sets the last loop flag at block 222 and proceeds to MIN 5 at block 224. If Y does not equal 0, the program simply branches to MIN 5 at block 224.

From MIN 5 at block 224, the program points to the next MSD at block 224 and makes a decision as to whether or not to continue the search at block 228. If the program decides to continue the search, it proceeds to MIN 1 at block 196 for again comparing the contents of stack memory location #5 with that in the temporary memory.

If at block 228 it is determined not to continue the search for the next higher channel number, the program proceeds to TEMCUR at 192 for loading the contents of the temporary memory into the current memory location. With the determination not to continue the search for the next higer channel number made at block 228, the program initiates a routine for moving the contents of the temporary location to the current memory location at block 192. This involves shifting the MSD and LSD contents of the temporary memory location to the current memory location at block 232. After the contents of the temporary memory location are thus transferred to the current memory location, the program exits the stack memory tuning routine at step 234.

There has thus been shown a microcomputer-controlled stack memory tuning system for a television receiver requiring only a limited memory capacity for storing tuning information for a limited number of preferred channels. Preferred channel numbers are stored in the memory by means of a keyboard and are shifted out therefrom on a first in/first out basis. Channel selection is made by means of a channel UP/DOWN selector(s) with provision made for automatically tuning to the next higher or next lower channel number regardless of the order in which the preferred channel numbers are entered in the stack memory.

While the description of the present invention has thus far emphasized its programmability aspects, the automatic de-programming capability inherent in this approach will be equally apparent to those skilled in the art. Thus, storage of a new channel number in the stack memory when all memory bit locations are occupied will result in the removal, or automatic de-programming, of the first entered channel number still stored in the stack memory. No further action is required of the viewer in this de-programming process. Thus, complicated hardware configurations and software procedures are avoided in removing a once preferred channel number from the preferred channel list stored in memory. This de-programming feature is automatic and instantaneous with entry of a new preferred channel number in the stack memory.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A system for tuning a television receiver, comprising:

a viewer operable channel number selection means for selectively generating a plurality of signals each representing a respective channel number;

current memory means responsive to operation of the channel number selection means for temporarily storing the currently selected channel number;

stack memory means comprising a plurality of sequential memory locations which are programmed for storing a plurality of preferred channel numbers in response to viewer operation of said channel number selection means by shifting in a given direction the contents of each memory location thereby vacating at least one memory location and storing the contents of the current memory means in the thus vacated memory location;

viewer operable channel scanning means for scanning said stack memory means for identifying the next higher or next lower channel number stored therein relative to the channel number stored in said current memory means and for replacing the contents of the current memory means with the thus identified channel number; and tuning means responsive to the contents of said current memory means for tuning said television receiver to the channel number stored therein.

2. A system as in claim 1 wherein said selection means includes a plurality of digit keys.

3. A system as in claim 2 wherein said selection means further includes an enter key for storing a preferred channel number in said stack memory means following selection of the desired digit keys.

4. a system as in claim 3 wherein a preferred channel number is stored in said stack memory means if said enter key is selected within a predetermined time interval of selection of said digit keys.

5. A system as in claim 1 wherein said channel scanning means detects the absence of a preferred channel number in said stack memory means higher or lower than the channel number in said current memory means and generates a tuning word representing the lowest or highest channel number, respectively, stored in said stack memory means.

6. A system as in claim 1 further including display means coupled to said current memory means for displaying a channel number entered by means of said selection means.

7. A system as in claim 1 wherein said preferred channel numbers are stored and shifted in said stack memory means on a first-in/first-out basis.

8. A system for tuning a television receiver, comprising:

viewer operable channel number selection means for selectively generating a plurality of signals each representing a respective channel number;

current memory means responsive to operation of the channel number selection means for temporarily storing the currently selected channel number;

stack memory means comprising a plurality of sequential memory locations which are programmed for storing a plurality of preferred channel numbers in response to viewer operation of said channel number selection means by shifting in a given direction the contents of each memory location thereby vacating at least one memory location and storing the contents of the current memory means in the thus vacated memory location;

viewer operable channel scanning means for scanning said stack memory means for identifying the next higher or lower channel number stored therein relative to the channel number stored in said current memory means, or if a higher or lower channel number relative to the channel number stored in said current memory means is not present in said stack memory means for identifying the lowest or highest channel number, respectively, stored in said stack memory means, and for replacing the contents of the current memory means with the thus identified channel number; and tuning means responsive to the contents of said current memory means for tuning said television receiver to the channel number stored therein.

9. A system for tuning a television receiver to any one of a limited number of preferred channels, said system comprising:

viewer operable channel number selection means for generating a plurality of signals each representing a respective channel number;

current memory means responsive to operation of said channel number selection means for temporarily storing the currently selected channel number;

stack memory means comprising a plurality of sequential memory locations which are programmed for storing a limited number of preferred channel numbers by shifting in a given direction the contents of each memory location thereby vacating at least one memory location;

channel number entry means responsive to a viewer input following entry of a channel number on said channel number selection means for transferring the currently selected channel number from said current memory means to the thus vacated memory location in said stack memory means;

viewer operable channel scanning means for scanning said stack memory means for identifying the next higher or lower channel number stored therein relative to the channel number stored in said current memory means, or if a higher or lower channel number relative to the channel number stored in said current memory means is not present in said stack memory means for identifying the lowest or highest channel number, respectively, stored in said stack memory means, and for replacing the contents of the current memory means with the thus identified channel number; and tuning means responsive to the contents of said current memory means for tuning said television receiver to the channel number stored therein.

10. A system as in claim 9 further including timing means coupled to said channel number entry means for disabling said channel number entry means if said channel number entry means is not selected within a predetermined time interval following selection of said channel number selection means and whereupon the selected channel number is not stored in said stack memory means.

* * * * *